United States Patent
Muraoka

(10) Patent No.: US 6,169,699 B1
(45) Date of Patent: Jan. 2, 2001

(54) SEMICONDUCTOR MEMORY DEVICE

(75) Inventor: Kazuyoshi Muraoka, Yokohama (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/469,964

(22) Filed: Dec. 21, 1999

(30) Foreign Application Priority Data

Dec. 24, 1998 (JP) .................................................. 10-367204

(51) Int. Cl.⁷ ..................................................... G11C 8/00
(52) U.S. Cl. ....................................... 365/230.03; 365/63
(58) Field of Search ......................... 365/230.03, 230.06, 365/189.04, 185.11, 63, 189.09, 226

(56) References Cited

U.S. PATENT DOCUMENTS

| | | | | |
|---|---|---|---|---|
| 5,287,485 | * | 2/1994 | Umina et al. | 365/230.03 |
| 5,619,472 | * | 4/1997 | Okamura | 365/230.03 |
| 5,970,016 | * | 10/1999 | Ohsawa | 365/230.03 |
| 5,978,304 | * | 11/1999 | Crafts | 365/230.03 |

FOREIGN PATENT DOCUMENTS 10-069767    3/1998  (JP) .

\* cited by examiner

Primary Examiner—Tan T. Nguyen
(74) Attorney, Agent, or Firm—Hogan & Hartson, LLP

(57) ABSTRACT

There is provided a multi-bank-structured DRAM capable of high-speed data transfer without enlarging the chip size due to increase of the line width of power source lines and addition of internal power source generation circuits. In a multi-bank-structured DRAM, cell array units forming each bank are assigned divisionally to cell array units in both sides of an interface circuit interposed therebetween. This division of cell array units is carried out such that those units that are positioned point-symmetrically with respect to the center of the interface circuit are selected and are assigned to one same bank. As a result, the layout of internal power source circuits in the interface circuit can be designed in match with half of power dissipation of the chip. The line width of power source lines can therefore be reduced to small. The chip size can also be reduced by dividing the power dissipation into independent internal power source generation circuits in accordance with the division of the cell array units.

20 Claims, 7 Drawing Sheets

SEMICONDUCTOR MEMORY DEVICE

BACKGROUND OF THE INVENTION

The present invention relates to a semiconductor memory device and particularly to assignment of bank addresses in a multi-bank-structured semiconductor memory device. This application is based on Japanese Patent Application No. 10-367204, filed Dec. 24, 1998, the content of which is incorporated herein by reference.

Several conventional semiconductor memory devices adopt a DRAM (Dynamic Random Access Memory) and comprise an interface circuit capable of high-speed data transfer. Taking a 72M-bit multi-bank-structured DRAM as an example, explanation will now be made to conventional techniques and problems thereof.

In the 72M-bit multi-bank-structured DRAM shown in FIG. 1, an interface circuit 1 capable of high-speed data transfer and including a pad group is arranged in parallel with lateral edges at an end of a silicon chip having two longitudinal edges and two lateral edges. The interface circuit performs input of commands and input/output of data and power supply from an external power source, through the pad group. Also, the interface circuit 1 includes an access control circuit for controlling access with memory cell arrays.

Formed in the main parts of the chip are memory cell arrays 2 each having a 16-bank structure extended like a matrix in the row and column directions. The interface circuit 1 is arranged along the row direction in one side of the array.

As shown in FIG. 1, the memory cell array 2 has a structure in which cell array units 3 each consisting of a 9/8M-bit memory cell group arranged in a matrix of 16 rows×4 columns. A row decoder 4 is provided between adjacent columns of cell array units 3.

Each column constructed by a plurality of cell array units 3 comprises 36 pairs of data lines 5. The 36 pairs of data lines 5 are connected to 36 pairs of DQ buffers 6. Therefore, the interface circuit 1 and the DQ buffers 6 arranged along the row direction of the memory cell array 2 are connected to each other by 144 pairs of data lines 5a (every 36 pairs are symbolized as a fat arrow). In this case, the data lines 5a include write lines and read lines or common write/read lines.

In addition, the DQ buffer is a circuit which operates to amplify and transfer data of the data line 5 during reading operation and also operates to drive the data line in accordance with the logic state of the data line 5a during writing operation.

One bank consists of one line of cell array units 3, and bank addresses such as B0 to B15 are assigned to banks sequentially from the side closest to the interface circuit 1. For example, if the bank address B0 is selected, four cell array units hatched in FIG. 1 and DQ buffers corresponding thereto are activated simultaneously thereby enabling operation. Therefore, all the banks forming the memory cell array 2 can be accessed in total 16 cycles.

In this multi-bank-structured DRAM, the operation cycle is set to be high in order to realize a high-speed data transfer rate, and a large amount of data is exchanged with the memory cells designated to the selected bank for every cycle. Therefore, the current dissipation is very large. In FIG. 1, data flow exchanged between cell array units of each column and the interface circuit 1 is indicated by a bi-directional arrow (data line 5a).

That is, the dissipated current consumed by the memory cell array 1 and subsidiary circuits thereof has come to be very large, e.g., the bit line restore (refresh) current is about 200 mA in case where a number of banks are sequentially activated in minimum cycles, and the dissipated current is about 250 mA in case where writing is sequentially performed in minimum cycles. Meanwhile, various subsidiary circuits, power source circuits, and pad groups are arranged closely in the interface circuit 1 and the peripheral portion thereof, thus making it very difficult to wire low-resistance power source lines with a sufficient line width therebetween.

For example, if normal operation should be guaranteed independently from the distance between the selected and activated banks and the power source pads when a power source voltage is supplied from an external power source connected to external terminals of a package through power source pads included in the pad groups, a large number of DQ buffers must be connected with pad groups through power lines having a low wiring resistance R, and a drop of the power source voltage due to an I*R drop and operation error of the memory cells caused by such a voltage drop must be avoided, with respect to a large current I dissipated by the memory cell array 2, DQ buffers 6, and control circuits thereof (not shown).

Therefore, the line width of the power lines must be enlarged throughout the narrow and long interface circuit 1. If the line width of the power lines is thus enlarged, there is a problem that the chip size increases accordingly.

In addition, since several kinds of internal power source voltages are normally required to operate a multi-bank-structure DRAM, it is necessary to maintain a space for integrating internal power source generation circuits which generate several kinds of internal power source voltages, into the peripheral portion of the interface circuit 1 (or within the inside thereof).

However, internal power source generation circuits occupy a large area in proportion to the size of the dissipated current I, leading to a problem of increase the chip size. That is, the following problem has occurred to realize these specifications and functions.

(1) Since the dissipated current of the memory cell array and subsidiary circuits is very large, the resistance of power source lines must be reduced. Therefore, the line width of the power source lines must be increased, resulting in increase of the chip size.

(2) In each of internal potential generation circuits such as internal power source circuits which generates a bit-line restore potential, reading from memory cells, boosting potential generation circuits for restoring word lines, and the like, the size of control transistors must be increased in accordance with increase of the loading current, and increase of the line width and provision of additional circuits are required. As a result, the chip size is increased.

BRIEF SUMMARY OF THE INVENTION

As has been described above, in a conventional multi-bank-structured DRAM, since selected banks are arranged deviated in the upper (or lower) side of the interface circuit, the operation current of the selected banks becomes very large so that the line width of the power source lines must be increased or internal power source circuits must be added, involving a problem that the chip size is enlarged. If the integration level of the multi-bank-structured DRAM is increased more in the future and the number of banks increases, this problem will become more important.

The present invention has been made to solve the above problem and has an object of providing a multi-bankstructured DRAM capable of high-speed transfer without causing enlargement of the chip size due to increase of the line width of power source lines or addition of internal power source generation circuits.

The semiconductor memory device according to the present invention is characterized in that a plurality of cell array units forming each bank are assigned divisionally to cell array units in both sides of an interface circuit interposed therebetween, in forming a multi-bank-structured DRAM capable of high-speed data transfer.

The division of the cell array units forming one bank is characterized in that those cell array units that are situated at point-symmetrical positions with respect to the center of the interface circuit are selected and assigned to one same bank.

Specifically, a semiconductor memory device according to the present invention comprises an interface circuit having a first side and a second side along a lengthwise direction of the interface circuit, a first memory cell array placed along the first side of the interface circuit and having a plurality of banks, each of which is formed of a column of cell array units placed along a direction perpendicular to the lengthwise direction of the interface circuit, a cell array unit activated by a bank address being included at least in one of the plurality of banks, and a second memory cell array placed along the second side of the interface circuit and having a plurality of banks, each of which is formed of a column of cell array units placed along a direction perpendicular to the lengthwise direction of the interface circuit, a cell array unit activated by the bank address being included at least in one of the plurality of banks.

A semiconductor memory device according to the present invention comprises a first cell array unit activated by a bank address and included at least in one of the plurality of banks in the first memory cell array, and a second cell array unit activated by the bank address and included at least in one of the plurality of banks in the second memory cell array, wherein the first and second cell array unit are situated at positions which are point symmetrical to each other with respect to a center of the interface circuit.

A semiconductor memory device according to the present invention, comprises an interface circuit having both sides along a lengthwise direction of the interface circuit, banks each consisting of a plurality of cell array units, and multi-bank-structured first and second memory cell arrays respectively provided in both sides of the interface circuit and each consisting of a plurality of banks, wherein cell array units activated by one same bank address are arranged to be divided into the first and second memory cell arrays.

Preferably, the cell array unit activated by the bank address is included at least in two banks adjacent to each other in the first and second memory cell arrays, respectively.

Preferably, the cell array unit activated by the bank address is placed at least in two banks adjacent with another one bank interposed therebetween in the first and second memory cell arrays, respectively.

A semiconductor memory device according to the present invention further comprises a first memory cell array placed along the first side of the interface circuit and having a plurality of banks, each of which is formed of a column of cell array units placed along a direction perpendicular to the lengthwise direction of the interface circuit, the plurality of banks having a first row decoder between a pair of the plurality of banks and a cell array unit activated by a bank address being included at least in one of the pair; and a second memory cell array placed along the second side of the interface circuit and having a plurality of banks, each of which is formed of a column of cell array units placed along a direction perpendicular to the lengthwise direction of the interface circuit, the plurality of banks having a second row decoder between a pair of the plurality of banks and a cell array unit activated by the bank address being included at least in one of the pair.

Preferably, the cell array unit activated by the bank address is included at least in the pair of banks in the first and second memory cell arrays, respectively.

Preferably, the first and second memory cell arrays are formed by placing a same pattern repeated along the lengthwise direction of the interface circuit.

Preferably, the semiconductor memory device further comprises a plurality of power source lines arranged along the lengthwise direction of the interface circuit, and a plurality of power source lines arranged so as to cross the lengthwise direction at right angle, between the interface circuit and each of the first and second memory cell arrays, wherein cross-points between the plurality of power source lines arranged along the lengthwise direction and the plurality of power source lines arranged so as to cross the lengthwise direction at right angles are connected with each other thereby to form a mesh-like power source line.

Preferably, the semiconductor memory device further comprises a plurality of internal power source generation circuits and an internal power source line between the first interface circuit and each of the first and second memory cell arrays, wherein the internal power source line consists of a plurality of power source lines arranged along the lengthwise direction of the interface circuit and a plurality of power source lines arranged so as to cross the lengthwise direction at right angles, and cross-points between the plurality of power source lines arranged along the lengthwise direction and the plurality of power source lines arranged so as to cross the lengthwise direction at right angles are connected with each other thereby to form the internal power line in form of a mesh.

In this manner, when a power source voltage is supplied from an external power source connected to external terminals of a package through power source pads included in an interface circuit, the number of banks selected by one same bank address is reduced practically by half, so that the supply current I to activated banks from the power source pads is reduced substantially to half and I*R drops due to the wiring resistance R of power source lines can be reduced.

In addition, by arranging the layout design of the internal power source circuits in match with half of power dissipation of the chip, the number of internal power source generation circuits in the peripheral portion of the interface circuit (or inside thereof) and the occupation area thereof can be reduced, and the line width of the internal power lines can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be explained with reference to the drawings.

Figure 2:
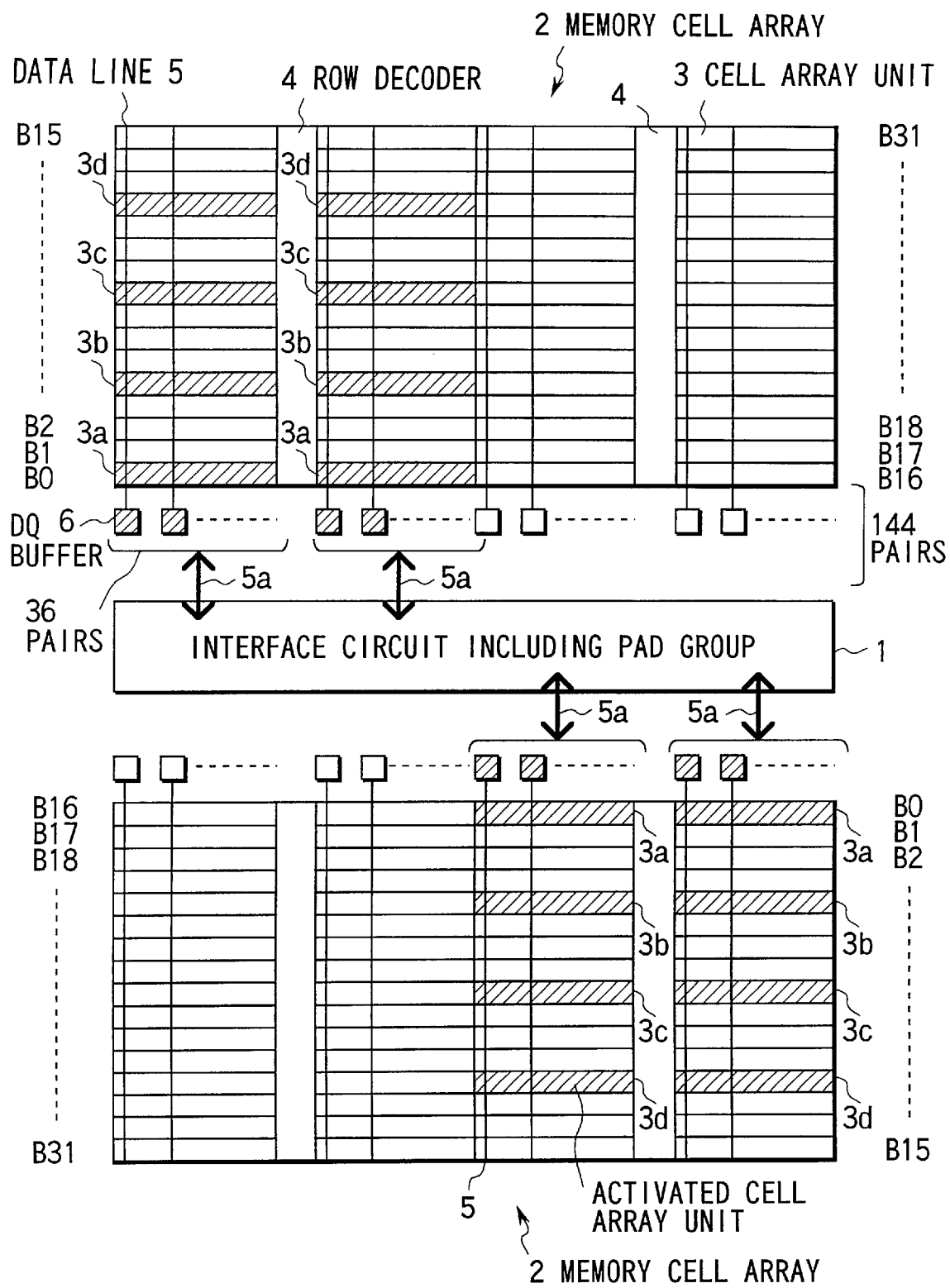
FIG. 2 is a view showing the circuit construction of a 144M-bit multi-bank-structured DRAM according to the first embodiment.

With reference to FIG. 2, explanation will be made of a circuit configuration and operation of a main part of a multi-bank-structured DRAM of 144M-bit. As for specifications, the multi-bank structured DRAM has a structure of 2×16 banks so that the memory capacity and the bank structure are expanded twice compared with a conventional 72M-bit multi-bank-structure DRAM.

In the 144M-bit multi-bank-structure DRAM shown in FIG. 2, an interface circuit 1 capable of high-speed data transfer, including a pad group, is arranged in parallel with lateral sides at the center portion of a silicon chip having two longitudinal sides and two lateral sides. Memory cell arrays 2 are provided along the interface circuit 1 in both sides thereof.

Figure 1:
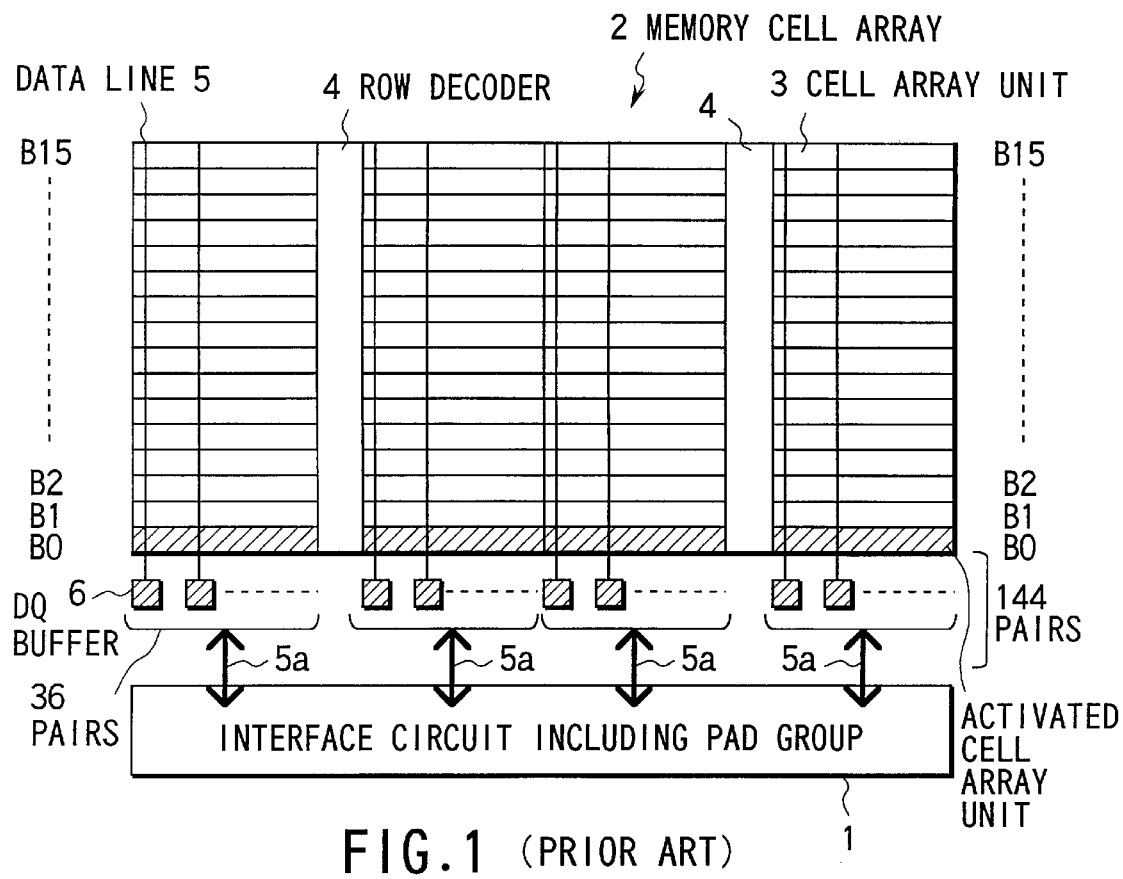
FIG. 1 is a view showing the circuit construction of a conventional 72M-bit multi-bank-structured DRAM.

The memory cell array 2 is divided into 9/8M-bit cell array units 3 arranged in a matrix-like layout, and four cell array units 3 are assigned to one bank address. Thus, the block structure shown in FIG. 1 is substantially the same as that of the 72M-bit multi-bank-structured DRAM shown in FIG. 2 and explained previously except that the memory cell arrays 2 are arranged symmetrically in both sides of the interface circuit 1 along the lengthwise direction thereof. Therefore, corresponding portions will be denoted at common reference symbols and explanation of the block structure will be omitted herefrom.

The 144M-bit multi-bank-structure DRAM shown in FIG. 2 is different from the conventional 72M-bit multi-bank-structured DRAM shown in FIG. 1 in how the bank addresses are assigned and how the cell array units are selected by the bank addresses.

As shown in FIG. 2, in the 144M-bit multi-bank-structure DRAM according to the present invention, bank addresses B0 to B15 are assigned to the bank of the cell array units 3 of the left end column in the upper side of the interface circuit 1 and also to the bank of the cell array units 3 of the right end column in the lower side.

Further, bank addresses B16 to B31 are assigned to the bank of the cell array units 3 of the right end column in the upper side of the interface circuit 1 and also to the bank of the cell array units 3 of the left end column in the lower side.

That is, in the 144M-bit multi-bank-structured DRAM of the present invention, four cell array units 3 selected and activated by one same bank address and DQ buffers 6 corresponding thereto are divided and assigned to matrixes consisting of upper and lower cell array units positioned symmetrically with respect to the center line in the lengthwise direction of the interface circuit. In FIG. 2, the flow of data exchanged between the cell array units of each column and the interface circuit 1 through the data lines 5 and DQ buffers 6 is indicated by bi-directional arrows (data lines 5a).

More specifically, for example, if a bank address B0 is selected by operation in one cycle, four cell array units 3a hatched in FIG. 2 are selected/activated. By next operation in second to fourth cycles, cell array units 3b, 3c, and 3d also hatched in the figure are subsequently selected/activated with use of corresponding bank addresses, respectively.

Thus, two cell array units 3 in each of upper and lower sides which are selected by one bank address have a distinguished feature that the entire upper and lower memory cell arrays 2 are regarded as a matrix-like arrangement including a plurality of cell array units with the interface circuit 1 situated in the center, and a plurality of cell array units including one same bank are assigned divisionally to cell array units positioned point-symmetrically with respect to the center of the interface circuit 1.

Although bank addresses of banks 0 to 15 are cited as an example in the above explanation, this is the same with the case of bank addresses of bank 16 to bank 31.

In the first embodiment, four cell array units are activated in one cycle like in the case of FIG. 1. Therefore, access to all the memory cells in the memory cell arrays 2 in the upper and lower sides of interface circuit 1 can be completed in total 32 cycles.

However, in the first embodiment, four selected/activated cell units hatched in FIG. 2 and corresponding DQ buffers are arranged separately in the upper and lower sides with the interface circuit 1. Accordingly, the row-based power source current including the restore current of the memory cells and the column-based power source current including the dissipated current for reading/writing memory data can be dispersed in upper and lower sides with the interface circuit 1 interposed therebetween.

Accordingly, the external power source current I supplied to activated banks from power source pads included in the interface circuit is reduced substantially to half, so that I*R drops due to the wiring resistance R of the power source lines can be reduced. In addition, if the layout design of the internal power source generation circuits is arranged in match with half of the dissipated current of the chip, the number of internal power source generation circuits and the occupation area thereof in the peripheral portion of the interface circuit (or inside thereof) can be reduced so that the line width of the internal power source lines can be reduced.

In the operation of the 144M-bit multi-bank-structure DRAM, if four cell array units selected/activated by one same bank address are arranged to be deviated only to the upper (or lower) side of the interface circuit 1 in accordance with the operation of the conventional 72M-bit multi-bank-structured DRAM, the operation current of the selected banks becomes very large so that the occupation area necessary for the interface circuit 1 is enlarged twice thereby to increase the chip size.

Next, with reference to FIG. 3, explanation will be made of operation of a 144M-bit multi-bank-structured DRAM according to a second embodiment of the present invention. The block structure of the 144M-bit multi-bank-structured DRAM is substantially the same as that of the first embodiment explained previously. Therefore, corresponding portions will be denoted at common reference symbols and explanation thereof will be omitted herefrom.

Figure 3:
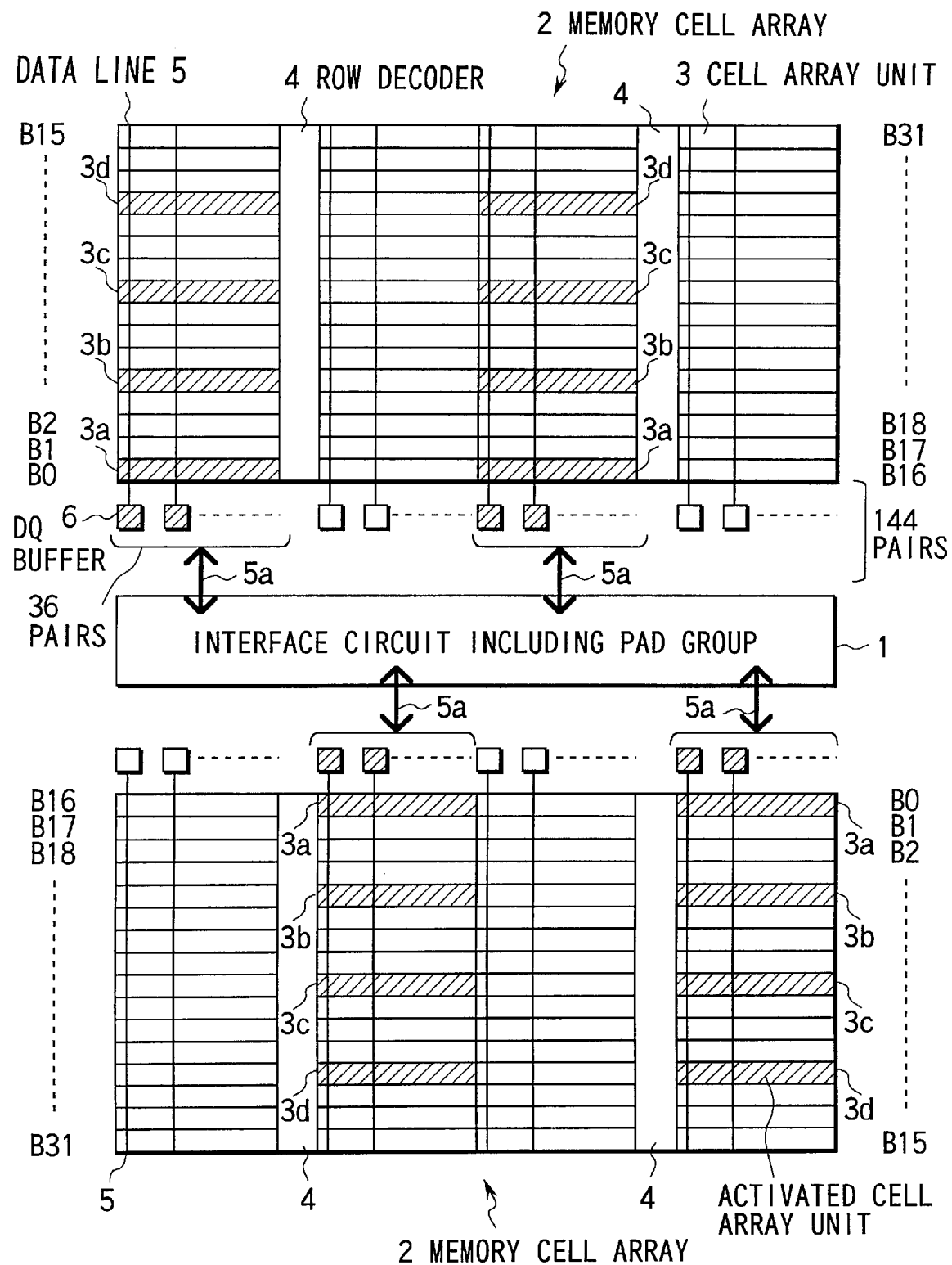
FIG. 3 is a view showing the circuit construction of a 144M-bit multi-bank-structured DRAM according to the second embodiment.

The 144M-bit multi-bank-structured DRAM shown in FIG. 3 is different from the first embodiment shown in FIG. 1 in how the bank addresses are assigned and how the cell array units are selected by the bank addresses.

The second embodiment has a distinguished feature that four cell array units 3 selected/activated by one same bank address, as hatched in FIG. 3, and DQ buffers 6 corresponding thereto are divisionally arranged alternately into banks including upper and lower cell unit arrays 3 positioned symmetrically with respect to the center line of the interface circuit 1 in the lengthwise direction thereof.

In FIG. 3, the flow of data between the cell array units in each column and the interface circuit 1 through the data lines 5 and the DQ buffers 6 is indicated by bidirectional arrows (data lines 5a).

Also, in FIG. 3, bank addresses B0 to B15 are assigned into the bank of the left end column in the upper side of the interface circuit 1 and also into the bank of the right end column in the lower side, and bank addresses B16 to B31 are assigned into the bank of the right end column in the upper side of the interface circuit 1 and also into the bank of the left end column in the lower side, like in FIG. 2.

However, in the second embodiment, since the cell array unit 3 selected/activated by one same bank address are divisionally assigned alternately to the upper and lower banks, internal bank addresses of B0 to B15 and B16 to B31 inside the matrixes (which are not shown) are also assigned to the upper and lower columns.

For example, if a bank address B0 is selected in the operation in a first cycle, four cell array units 3a hatched in FIG. 3 are activated. Next, in second to fourth cycles, cell array units 3b, 3c, and 3d hatched likewise are subsequently activated with use of corresponding bank addresses, respectively.

That is, the 144M-bit multi-bank-structured DRAM in the second embodiment has a sub-structure in which the first and second banks including the first and second columns in the memory cell array 3 arranged like a matrix are opposed to each other with a row decoder 4 inserted therebetween and arranged such that the lengthwise direction of the row decoder 4 is perpendicular to the lengthwise direction of the interface circuit 1, and the DRAM thus has a pattern structure which can be extended by forming a pattern such that this sub-structure is repeated in the lateral direction.

This DRAM also has a distinguished feature that if the entire of the substructure in the upper and lower sides of the interface circuit 1 (e.g., the left half of the upper and lower patterns shown in FIG. 3) is regarded as a matrix-like arrangement including a plurality of cell array units, the cell array units forming one same bank are assigned divisionally to cell array units 3a situated positions point-symmetrical to each other in the first column of the unit cell array 3 forming part of the sub-structure in the upper side and in the second column of the cell array unit 3 forming part of the sub-structure in the lower side.

Although explanation has been made of a case where cell array units 3 forming one same bank are selected/activated by bank addresses B0 to B15, operation for bank addresses B16 to B31 will be performed in a similar manner, and therefore, explanation thereof will be omitted herefrom.

Also, in the second embodiment, four cell array units are activated in one cycle like in the first embodiment. Therefore, access to all the memory cells in the memory cell arrays 2 in the upper and lower sides of interface circuit 1 can be completed in total 32 cycles.

In this manner, the external power source current I supplied to activated banks from power source pads included in the interface circuit is reduced substantially to half, like in the first embodiment, so that I*R drops due to the wiring resistance R of the power source lines can be reduced. In addition, if the layout design of the internal power source generation circuits is arranged in match with half of the dissipated current of the chip, the number of internal power source generation circuits and the occupation area thereof in the peripheral portion of the interface circuit (or inside thereof) can be reduced so that the line width of the internal power source lines can be reduced.

Next, with reference to FIG. 4, a third embodiment of the present invention will be explained. In the third embodiment, specific explanation will be made of advantages in that the plurality of cell array units forming one same bank as described in the first embodiment are assigned divisionally to cell array units situated at positions point-symmetrical to each other with respect to the center of the interface circuit, and the I*R drops due to the wiring resistance R of external power source lines included in the interface circuit are thereby reduced.

As has been explained previously, if the plurality of cell array units selected/activated by one same bank address and DQ buffers corresponding thereto are assigned divisionally to the upper and lower side of the interface circuit, the external power source current I supplied from outside through the power source pad group included in the interface circuit 1 can be practically reduced to half, and at the same time, the external power source current I can further be dispersed in the peripheral portion of the interface circuit 1 (or inside thereof).

Figure 4:
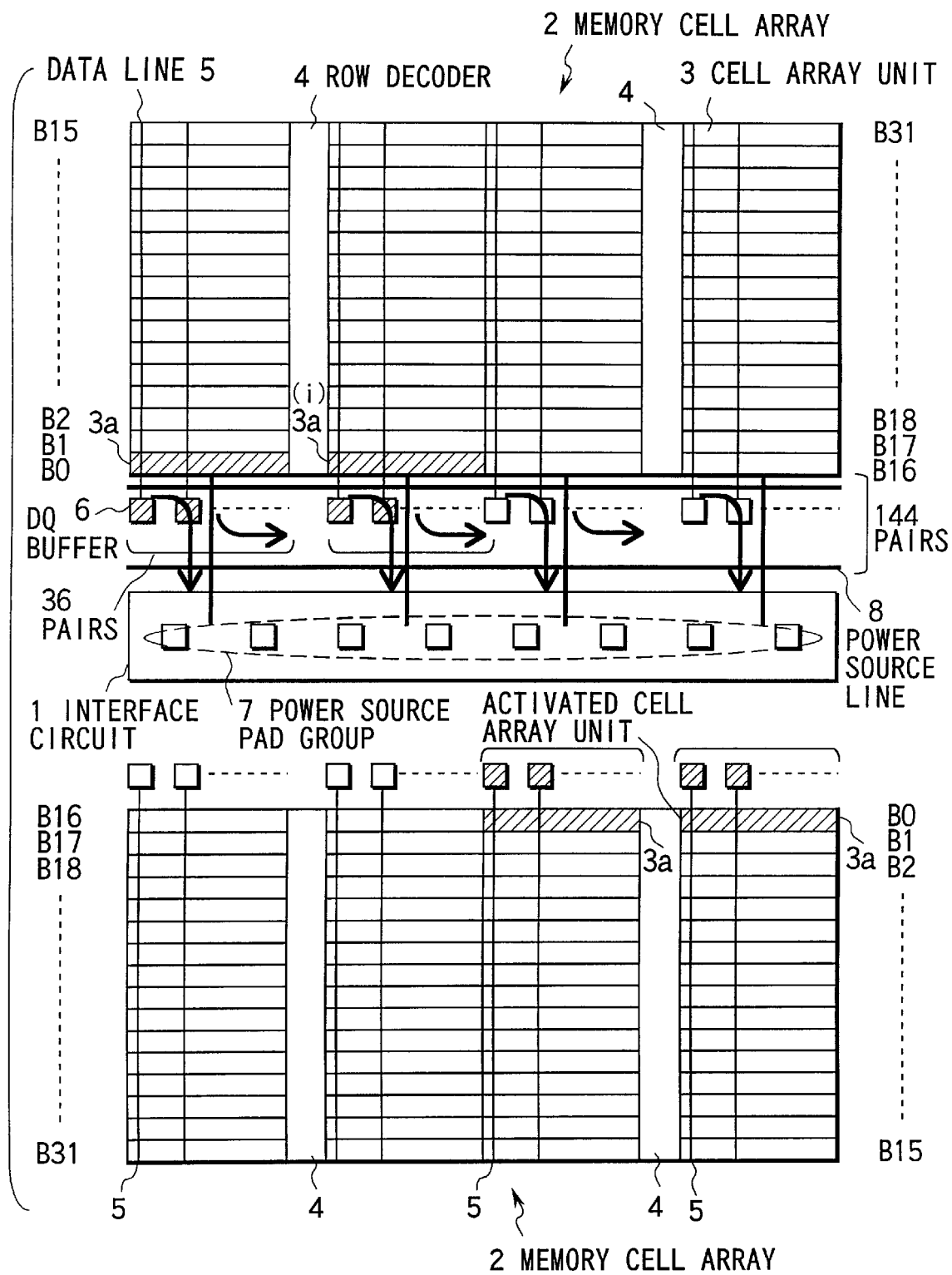
FIG. 4 is a view showing the distribution of external power source current according to the third embodiment.

That is, in FIG. 4, the power source line 8 is arranged like a mesh between the upper memory cell array 2 and the interface circuit 1 in order to reduce the wiring resistance R as much as possible. Note that all the cross-points of the mesh are connected. Each of power source lines led in the longitudinal direction to the interface circuit 1 is connected to an external power source (not shown) through the closest one power source pad group 7. Note that the mesh-like power source line 8 (not shown) is also provided between the lower memory cell array 2 and the interface circuit 1.

As shown in FIG. 4, for example, the cell array units 3a selected/activated by a bank address B0 and corresponding DQ buffers are arranged to be divided into the upper and lower sides of the interface circuit 1, the external power source current I supplied to the selected/activated cell array units 3a in the upper side and corresponding DQ buffers can be dispersed by using those power source pad group 7 corresponding to unselected cell array units and DQ buffers, in addition to the closest power source pad group 7.

In this manner, not only the external power source current I is reduced to half but also I*R drops can be advantageously reduced due to the dispersion effect of the external power source current as described above. Note that the direction of the current indicated by arrows in FIG. 4 shows the direction in which the current flows into the ground side of the external power source.

Figure 5:
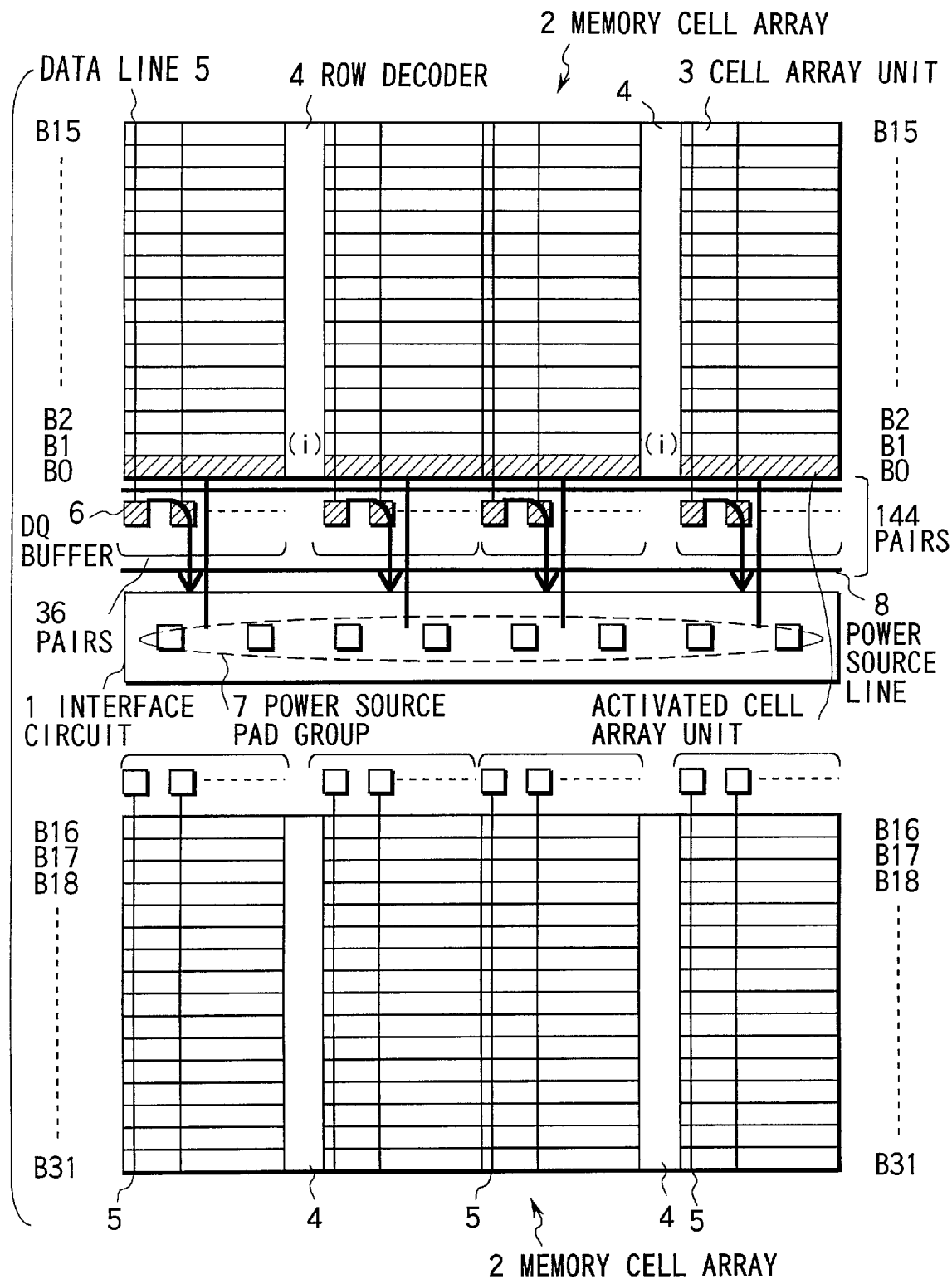
FIG. 5 is a view showing the distribution of external power source current where banks are structured in accordance with a conventional 72M-bit multi-bank-structured DRAM.

Meanwhile, as indicated by arrows in FIG. 5, in the operation of the 144M-bit multi-bank-structured DRAM, if four banks selected/activated by one same bank address are arranged and deviated only in the upper (or lower) side of the interface circuit in accordance with a conventional 72M-bit multi-bank-structured DRAM, the current component dispersed in the lengthwise direction of the interface circuit 1 is reduced with respect to the power source lines arranged like FIG. 4, and therefore, the current is concentrated in the longitudinal direction, so that the I*R drop increases. Note that the mesh-like power source line 8 (not shown) is also provided between the lower memory cell array 2 and the interface circuit 1.

Next, a fourth embodiment of the present invention will be explained with reference to FIG. 6. In the fourth embodiment, explanation will be made of a circuit structure of an internal power source generation circuit used in the 144M-bit multi-bank-structured DRAM according to the present invention.

Figure 6:
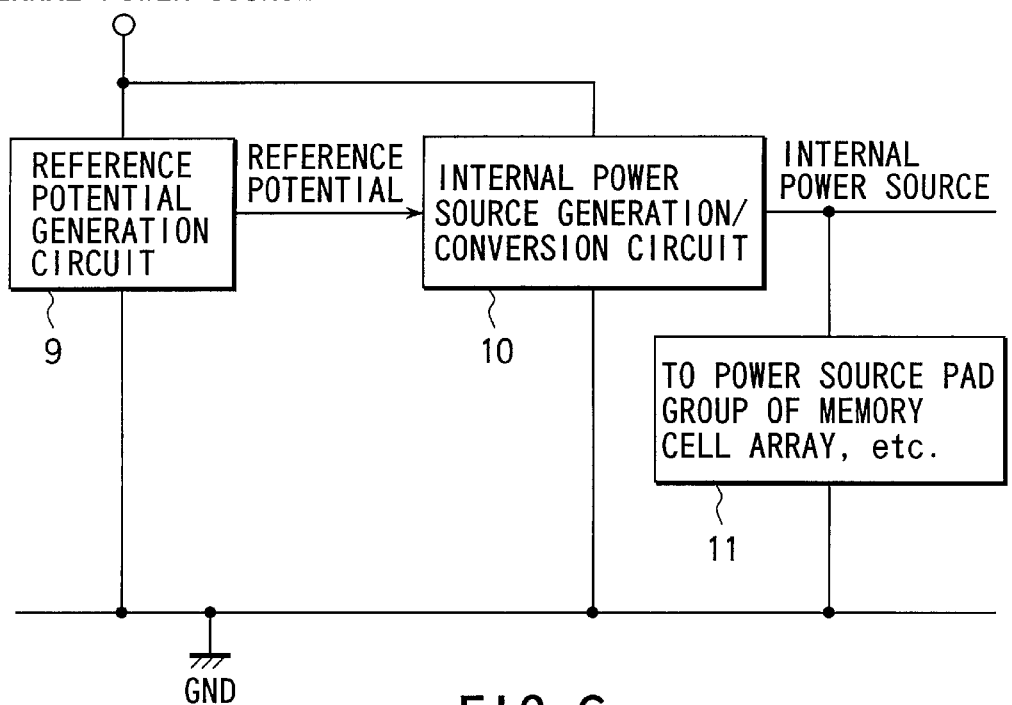
FIG. 6 is a view showing the construction of the internal power source generation circuit according to the fourth embodiment.

As shown in FIG. 6, a reference potential generation circuit 9 formed in a part of an internal power source line area and an internal power source generation/conversion circuit 10 are connected to an external power source through power source pad group 11 included in the interface circuit 1, thereby forming an internal power source. The internal power source generation circuit is connected to power source pad group of memory cell array, etc., and supplies an operation voltage and a current.

Since the 144M-bit multi-bank-structured DRAM according to the present invention adopts a multiple power source system, it is necessary to form several kinds of internal power source generation circuits whose power consumption is as low as possible and occupation area is small.

Next, a fifth embodiment of the present invention will be explained with reference to FIG. 7. Explanation will be specifically made of an advantage that the occupation area of the internal power source generation circuit in the periphery of the interface circuit is reduced since the plurality of cell array units forming one same bank as described in the first embodiment are assigned divisionally to cell array units situated at positions point-symmetrical to each other with respect to the center of the interface circuit.

As has been explained previously, if the plurality of cell array units selected/activated by one same bank address and DQ buffers corresponding thereto are assigned divisionally to the upper and lower side of the interface circuit, the internal current I supplied can be practically reduced to half in the peripheral region of the interface circuit 1.

Figure 7:
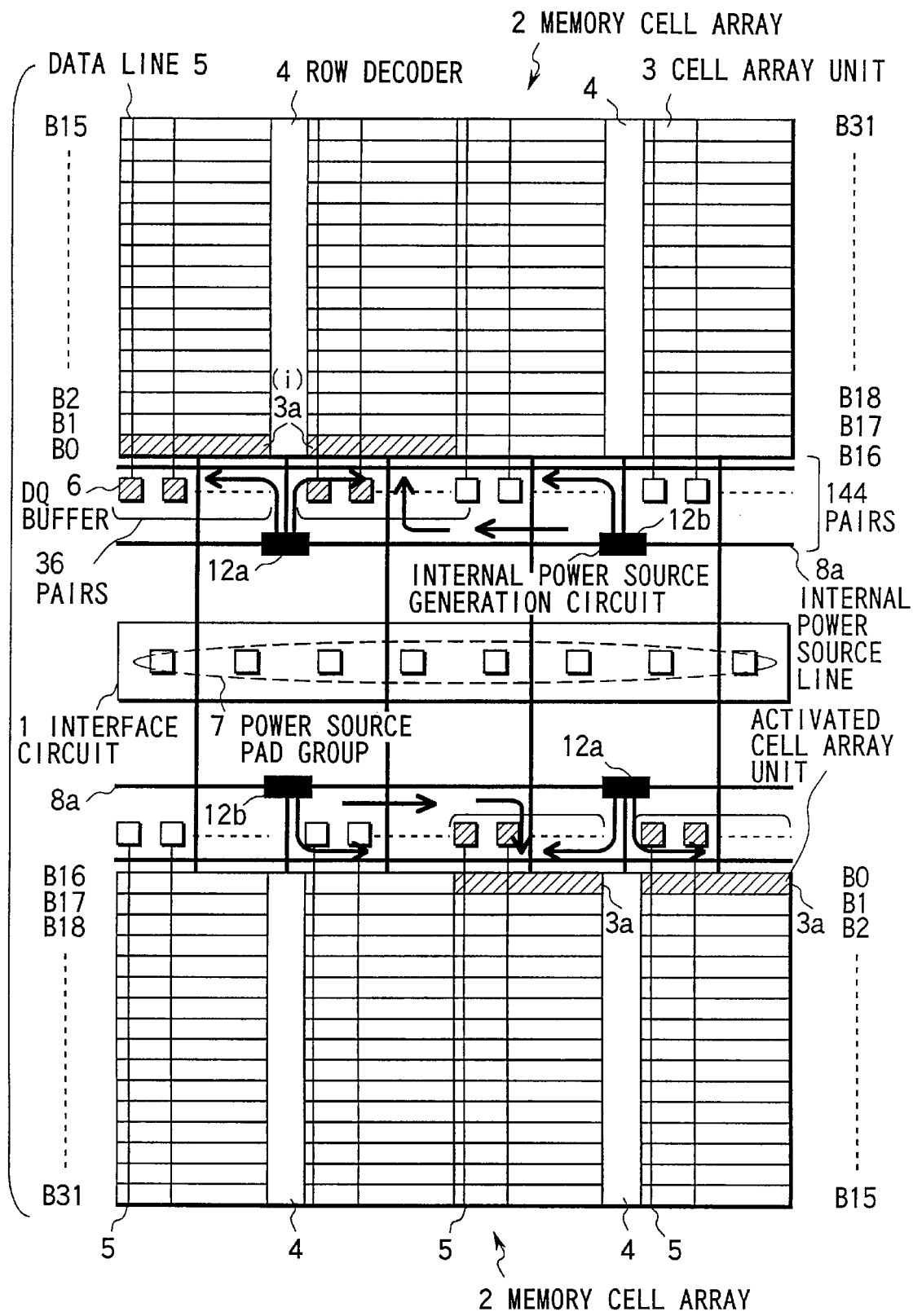
FIG. 7 is a view showing the distribution of internal power source current according to the third embodiment.

That is, in FIG. 7, the internal power source line 8a is arranged like a mesh between the upper memory cell array 2 and the interface circuit 1 in order to reduce the wiring resistance R as much as possible, and all the cross-points of the mesh are connected. An internal circuit current I for the internal circuits is supplied to the two selected/activated cell array units 3a in the upper side of the interface circuit 1 and corresponding DQ buffers, from the closest internal power source 12a, as indicated by arrows in FIG. 7.

However, for example, if two unselected cell array units continuous to two selected cell array units, hatched in FIG. 7, in the row direction in the upper side are activated by a bank address B16, another internal power source 12b must be prepared as the closest internal power source in addition to the internal power source 12a.

Note that, in FIG. 7, these two internal power sources 12a and 12b and the mesh-like internal power source line 8a connecting the sources are also formed between the interface circuit 1 and the lower memory cell array 2.

Accordingly, as shown in FIG. 7, with respect to two selected/activated cell array units 3a in the upper side of the interface circuit 1 and corresponding DQ buffers, internal power source currents I can be supplied from internal power source generation circuits 12a and 12b provided separately at two positions to the two selected/activated cell array units 3a.

In this manner, not only the internal power source current I is practically reduced to half and the occupation area of the internal power source is reduced to be small, but also I*R drops in the internal power source line 8a can be advantageously reduced due to the dispersion effect of the internal power source current I. Note that the direction of the current indicated by arrows in FIG. 7 shows the direction in which the current flows from the positive electrode of the internal power source.

Figure 8:
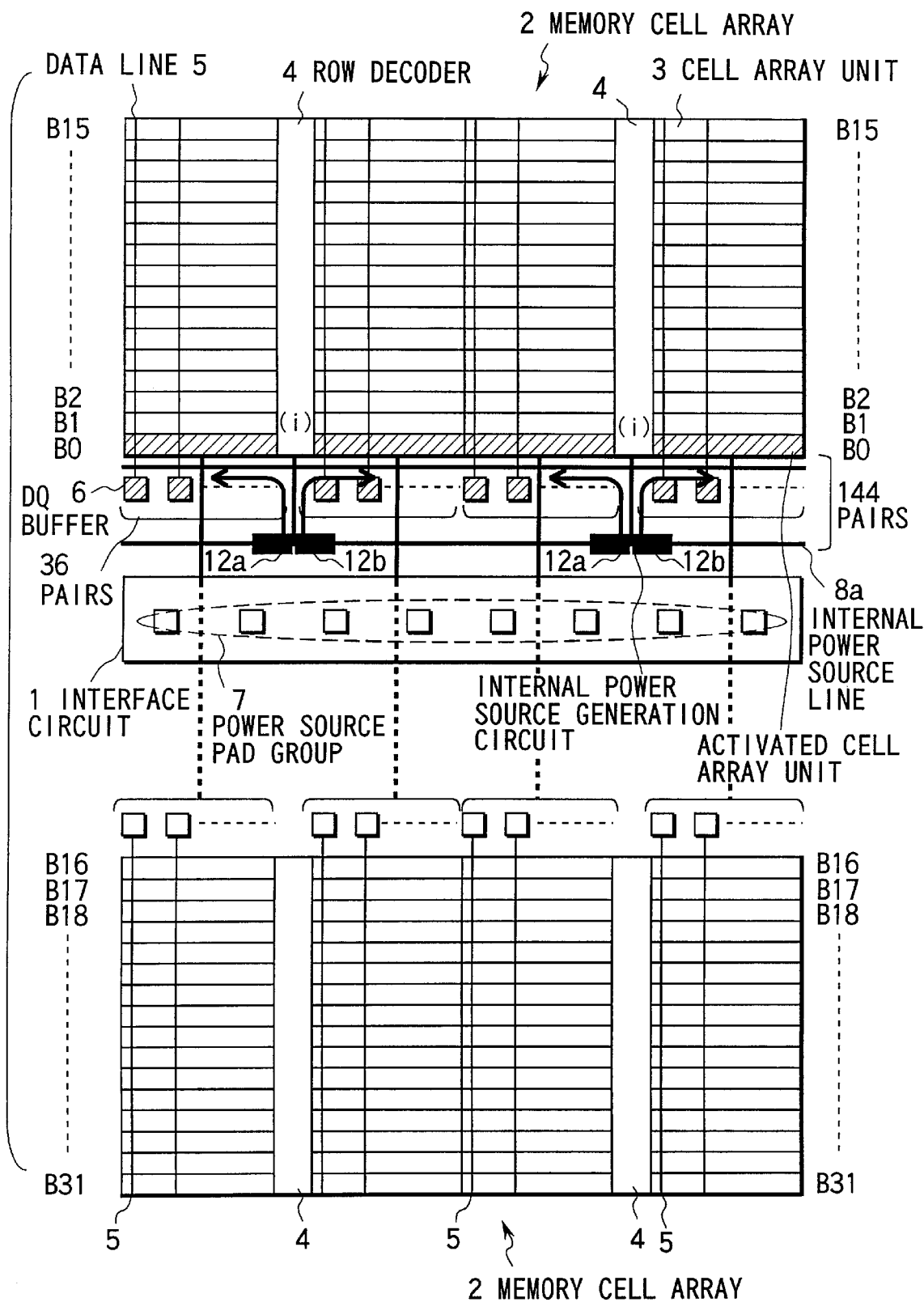
FIG. 8 is a view showing the distribution of internal power source current where banks are structured in accordance with a conventional 72M-bit multi-bank-structured DRAM.

As shown in FIG. 8, in the operation of the 144M-bit multi-bank-structured DRAM, if four banks selected/activated by one same bank address are arranged and deviated only in the upper (or lower) side of the interface circuit 1 in accordance with a conventional 72M-bit multi-bank-structured DRAM, the internal power source generation circuits 12a and 12b require a current-carrying capacity which is at least twice larger, and the I*R drop is increased due to increase of the current density. Therefore, the line width must be increased, resulting in increase of the chip area.

In FIG. 8, the internal power source generation circuits 12a and 12b are not shown in the lower side.

Note that the present invention is not limited to the above embodiments. Although the first embodiment has explained a case in which two upper cell array units 3 and two lower cell array units 3 which are selected by one bank address are situated at positions point-symmetrical to each other with respect to the center of the interface circuit 1, the present invention is not limited hitherto. The same effect can be obtained as long as the cell array units to be selected by one bank address are dispersively arranged in the upper and lower sides of the interface circuit. At this time, the number of cell array units in the upper side and that in the lower side need not always be equal to each other.

In addition, the first embodiment has been explained with respect to a multi-bank-structured DRAM of 144M-bit as a target. However, the integration level is not always limited to 144M-bit. For example, in case where the memory cell arrays are constructed in an extendable structure as explained in the second embodiment and the integration level is much increased, the advantage of chip-size reduction due to assignation of bank addresses according to the present invention can be obtained for any arbitrary integration level as long as the memory cell arrays are divided into the upper and lower sides or into the left and right sides.

Also, in the embodiments described previously, explanation has been made of a multi-bank-structured DRAM including an interface circuit capable of high-speed data transfer, as an example. The present invention is not always limited to a DRAM. A similar technique can be widely used for semiconductor memory devices having other circuit forms in addition to the DRAM. Furthermore, the present invention can be variously modified and practiced without deviating from the scope of the invention.

As has been explained above, according to the present invention, the row-based power source current mainly including the restore current for memory cells and the dissipated current for reading and writing data in the DQ buffers can be dispersed to the upper and lower sides with the interface circuit 1 interposed therebetween, in a multi-bank-structured DRAM capable of high-speed data transfer.

Accordingly, the occupation area of the internal power source generation circuits can be reduced by carrying out the layout design of the internal power source generation circuits in match with half of the dissipated power of the chip. In addition, the power source current is supplied dispersively. Therefore, the line width of the power source lines can be reduced with respect to both the external and internal power sources, so that the chip-size can be reduced.

In addition, the internal power source generation circuit is divided and supplied to the cell array units arranged in both sides of the interface circuit interposed therebetween, and mutual connection lines are utilized to disperse the power source currents, so that the length of the internal power source lines can be shortened and the wiring resistance can be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   an interface circuit having a first side and a second side along a lengthwise direction of the interface circuit;
   a first memory cell array placed along the first side of said interface circuit and having a plurality of banks, each of which is formed of a column of cell array units placed along a direction perpendicular to the lengthwise direction of said interface circuit, a cell array unit activated by a bank address being included at least in one of said plurality of banks; and
   a second memory cell array placed along the second side of said interface circuit and having a plurality of banks, each of which is formed of a column of cell array units placed along a direction perpendicular to the lengthwise direction of said interface circuit, a cell array unit activated by said bank address being included at least in one of said plurality of banks.

2. A semiconductor device according to claim 1, wherein the cell array unit activated by said bank address is included at least in two banks adjacent to each other in said first and second memory cell arrays, respectively.

3. A semiconductor device according to claim 1, wherein the cell array unit activated by said bank address is included at least in two banks adjacent with another one bank interposed therebetween in said first and second memory cell arrays, respectively.

4. A device according to claim 1, further comprising a plurality of power source lines arranged along the lengthwise direction of the interface circuit, and a plurality of power source lines arranged so as to cross the lengthwise direction at right angle, between the interface circuit and each of the first and second memory cell arrays, wherein
   cross-points between the plurality of power source lines arranged along the lengthwise direction and the plurality of power source lines arranged so as to cross the lengthwise direction at right angles are connected with each other thereby to form a mesh-like power source line.

5. A device according to claim 1, further comprising a plurality of internal power source generation circuits and an internal power source line between the first interface circuit and each of the first and second memory cell arrays, wherein
   the internal power source line includes a plurality of power source lines arranged along the lengthwise direction of the interface circuit and a plurality of power source lines arranged so as to cross the lengthwise direction at right angles, and
   cross-points between the plurality of power source lines arranged along the lengthwise direction and the plurality of power source lines arranged so as to cross the lengthwise direction at right angles are connected with each other thereby to form the internal power line in form of a mesh.

6. A semiconductor memory device comprising:
   an interface circuit having both sides along a lengthwise direction of the interface circuit;
   banks each including a plurality of cell array units; and
   multi-bank-structured first and second memory cell arrays respectively provided in both sides of the interface circuit and each including a plurality of banks, wherein
   cell array units activated by one same bank address are arranged to be divided into the first and second memory cell arrays.

7. A semiconductor device according to claim 6, wherein the cell array unit activated by said one same bank address is included at least in two banks adjacent to each other in said first and second memory cell arrays, respectively.

8. A semiconductor device according to claim 6, wherein the cell array unit activated by said one same bank address is included at least in two banks adjacent with another one bank interposed therebetween in said first and second memory cell arrays, respectively.

9. A device according to claim 6, further comprising a plurality of power source lines arranged along the lengthwise direction of the interface circuit, and a plurality of power source lines arranged so as to cross the lengthwise direction at right angle, between the interface circuit and each of the first and second memory cell arrays, wherein
   cross-points between the plurality of power source lines arranged along the lengthwise direction and the plurality of power source lines arranged so as to cross the lengthwise direction at right angles are connected with each other thereby to form a mesh-like power source line.

10. A device according to claim 6, further comprising a plurality of internal power source generation circuits and an internal power source line between the first interface circuit and each of the first and second memory cell arrays, wherein
    the internal power source line includes a plurality of power source lines arranged along the lengthwise direction of the interface circuit and a plurality of power source lines arranged so as to cross the lengthwise direction at right angles, and
    cross-points between the plurality of power source lines arranged along the lengthwise direction and the plurality of power source lines arranged so as to cross the lengthwise direction at right angles are connected with each other thereby to form the internal power line in form of a mesh.

11. A semiconductor memory device comprising:
    an interface circuit having a first side and a second side along a lengthwise direction of the interface circuit;
    a first memory cell array placed along the first side of said interface circuit and having a plurality of banks, each of which is formed of a column of cell array units placed along a direction perpendicular to the lengthwise direction of said interface circuit, a first cell array unit activated by a bank address being included at least in one of said plurality of banks; and a second memory cell array placed along the second side of said interface circuit and having a plurality of banks, each of which is formed of a column of cell array units placed along a direction perpendicular to the lengthwise direction of said interface circuit, a second cell array unit activated by said bank address being included at least in one of said plurality of banks, wherein said first and second cell array units are situated at positions which are point-symmetrical to each other with respect to a center of the interface circuit.

12. A semiconductor device according to claim 11, wherein the cell array unit activated by said bank address is included at least in two banks adjacent to each other in said first and second memory cell arrays, respectively.

13. A semiconductor device according to claim 11, wherein the cell array unit activated by said bank address is placed at least in two banks adjacent with another one bank interposed therebetween in said first and second memory cell arrays, respectively.

14. A device according to claim 11, further comprising a plurality of power source lines arranged along the lengthwise direction of the interface circuit, and a plurality of power source lines arranged so as to cross the lengthwise direction at right angle, between the interface circuit and each of the first and second memory cell arrays, wherein cross-points between the plurality of power source lines arranged along the lengthwise direction and the plurality of power source lines arranged so as to cross the lengthwise direction at right angles are connected with each other thereby to form a mesh-like power source line.

15. A device according to claim 11, further comprising a plurality of internal power source generation circuits and an internal power source line between the first interface circuit and each of the first and second memory cell arrays, wherein the internal power source line includes a plurality of power source lines arranged along the lengthwise direction of the interface circuit and a plurality of power source lines arranged so as to cross the lengthwise direction at right angles, and cross-points between the plurality of power source lines arranged along the lengthwise direction and the plurality of power source lines arranged so as to cross the lengthwise direction at right angles are connected with each other thereby to form the internal power line in form of a mesh.

16. A semiconductor memory device comprising:

an interface circuit having a first side and a second side along a lengthwise direction of the interface circuit;

a first memory cell array placed along the first side of said interface circuit and having a plurality of banks, each of which is formed of a column of cell array units placed along a direction perpendicular to the lengthwise direction of said interface circuit, said plurality of banks having a first row decoder between a pair of said plurality of banks and a cell array unit activated by a bank address being included at least in one of said pair; and a second memory cell array placed along the second side of said interface circuit and having a plurality of banks, each of which is formed of a column of cell array units placed along a direction perpendicular to the lengthwise direction of said interface circuit, said plurality of banks having a second row decoder between a pair of said plurality of banks and a cell array unit activated by said bank address being included at least in one of said pair.

17. A semiconductor device according to claim 16, wherein the cell array unit activated by said bank address is included at least in said pair of banks in said first and second memory cell arrays, respectively.

18. A semiconductor device according to claim 16, wherein said first and second memory cell arrays are formed by placing a same pattern repeated along the lengthwise direction of said interface circuit.

19. A device according to claim 16, further comprising a plurality of power source lines arranged along the lengthwise direction of the interface circuit, and a plurality of power source lines arranged so as to cross the lengthwise direction at right angle, between the interface circuit and each of the first and second memory cell arrays, wherein cross-points between the plurality of power source lines arranged along the lengthwise direction and the plurality of power source lines arranged so as to cross the lengthwise direction at right angles are connected with each other thereby to form a mesh-like power source line.

20. A device according to claim 16, further comprising a plurality of internal power source generation circuits and an internal power source line between the first interface circuit and each of the first and second memory cell arrays, wherein the internal power source line includes a plurality of power source lines arranged along the lengthwise direction of the interface circuit and a plurality of power source lines arranged so as to cross the lengthwise direction at right angles, and cross-points between the plurality of power source lines arranged along the lengthwise direction and the plurality of power source lines arranged so as to cross the lengthwise direction at right angles are connected with each other thereby to form the internal power line in form of a mesh.

* * * * *